US012712160B2

(12) United States Patent
Bhosle et al.

(10) Patent No.: US 12,712,160 B2
(45) Date of Patent: Aug. 18, 2026

(54) RF BLOCKER FOR UNIFORMITY CONTROL

(71) Applicant: Applied Materials, Inc., Santa Clara, CA (US)

(72) Inventors: Vikram M. Bhosle, Reading, MA (US); Alexandre Likhanskii, Middleton, MA (US); Stacia Pacheco, Lincoln, ME (US); John Robert Fairhurst, Plaistow, NH (US); Meng Cai, North Andover, MA (US); Cuiyang Wang, Andover, MA (US); Deven Matthew Raj Mittal, Middleton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 76 days.

(21) Appl. No.: 18/398,353

(22) Filed: Dec. 28, 2023

(65) Prior Publication Data

US 2025/0218742 A1 Jul. 3, 2025

(51) Int. Cl.
*H01J 37/32* (2006.01)

(52) U.S. Cl.
CPC ..... *H01J 37/32651* (2013.01); *H01J 37/3211* (2013.01); *H01J 2237/3323* (2013.01); *H01J 2237/3365* (2013.01)

(58) Field of Classification Search
None
See application file for complete search history.

(56) References Cited

U.S. PATENT DOCUMENTS 6,565,717 B1 * 5/2003 Leet .................. H01J 37/32477 204/192.12
7,820,533 B2 10/2010 Miller et al.
11,854,770 B2 * 12/2023 Liu ..................... H01L 21/0217
(Continued)

FOREIGN PATENT DOCUMENTS

KR 10-0783071 B1 11/2007
KR 10-0777841 B1 12/2007
(Continued)

OTHER PUBLICATIONS

International Search Report and Written Opinion mailed Feb. 21, 2025 in corresponding PCT application No. PCT/US2024/054701.

*Primary Examiner* — Kenneth B Wells
(74) *Attorney, Agent, or Firm* — Nields, Lemack & Frame, LLC

(57) ABSTRACT

A semiconductor processing system with improved plasma density is disclosed. The system includes a plasma chamber having a base, chamber walls and a top wall. An antenna is used to generate RF energy that is inductively coupled into the plasma chamber. The antenna comprises a plurality of coils that are proximate a dielectric window. One or more RF blockers are disposed adjacent to the dielectric window to block some of the RF energy from entering the plasma chamber. If the RF blocker is placed near a region of high plasma density, the density in that region may be reduced, improving the uniformity of the plasma density within the plasma chamber. Further, the RF blockers may have openings and may also be overlapped to create varying degrees of blocking.

10 Claims, 9 Drawing Sheets

(56) References Cited

U.S. PATENT DOCUMENTS

2002/0159276 A1* 10/2002 Deboy .............. H02M 3/33507
363/20
2010/0151694 A1* 6/2010 Peuse ................ H01L 21/02238
438/770
2011/0174606 A1* 7/2011 Funk ................... H01J 37/3244
422/105
2012/0152901 A1* 6/2012 Nagorny ........... H01J 37/32715
216/68
2012/0273130 A1* 11/2012 Drewery ........... H01J 37/32651
361/816
2013/0186568 A1* 7/2013 Long ........................ H05K 9/00
156/345.48
2014/0265832 A1* 9/2014 Kenney ................ H01J 37/3211
315/34
2015/0235813 A1* 8/2015 Miura ................. C23C 16/4584
156/345.28
2016/0247680 A1* 8/2016 O'Meara .............. H10D 84/038
2017/0170018 A1* 6/2017 Kim .................... H01L 21/3242
2018/0082824 A1* 3/2018 Likhanskii ........ H01J 37/32935
2021/0020404 A1* 1/2021 Savas ................ H01L 21/31111
2021/0035779 A1 2/2021 Biloiu et al.
2021/0391150 A1* 12/2021 Lea ................... H01L 21/30604
2022/0020557 A1 1/2022 Wallace et al.
2023/0049431 A1 2/2023 Sheng et al.
2024/0258079 A1* 8/2024 Jeon .................. H01J 37/32357
2025/0112027 A1* 4/2025 Kim ......................... H05H 1/24
2025/0157791 A1* 5/2025 Zhang ................... H01J 37/321

FOREIGN PATENT DOCUMENTS

TW 202107503 A 2/2021
WO 2021/011771 A1 1/2021

* cited by examiner 107
101
104
105
123
122
102
125
205
200

107
101
104
105
200
123
122
102
205
125

RF BLOCKER FOR UNIFORMITY CONTROL

FIELD

Embodiments of the present disclosure relate to systems for improving the uniformity of the plasma density in a plasma chamber, and more particularly, improving the plasma uniformity when higher pressures are used within the plasma chamber.

BACKGROUND

Semiconductor workpieces are often implanted with dopant species to create a desired conductivity. Plasma implantation is an effective method of doping or otherwise modifying surfaces of a semiconductor workpiece to form devices, such as transistors. In some embodiments, a plasma chamber is used to perform these implants. Further, in other embodiments, a plasma chamber may be used to deposit a material on a surface of the semiconductor workpiece.

Recently, it has been found that using a plasma chamber with increased pressure may be beneficial for several applications, such as sidewall doping for CMOS image sensors and reducing contact resistance for memory devices.

However, the plasma generated within the plasma chamber may be non-uniform and this non-uniformity may be exacerbated by the higher pressure within the plasma chamber.

Therefore, an apparatus that allows adjustment and tuning of the plasma density within a plasma chamber would be beneficial. Further, it would be beneficial if this apparatus may be readily incorporated into existing semiconductor processing equipment.

SUMMARY

A semiconductor processing system with improved plasma density uniformity is disclosed. The system includes a plasma chamber having a base, chamber walls and a top wall. An antenna is used to generate RF energy that is inductively coupled into the plasma chamber. The antenna comprises a plurality of coils that are proximate to a dielectric window. One or more RF blockers are disposed adjacent to the dielectric window to block some of the RF energy from entering the plasma chamber. If the RF blocker is placed near a region of high plasma density, the density in that region may be reduced, improving the uniformity of the plasma density within the plasma chamber. Further, the RF blockers may have openings and may also be overlapped to create varying degrees of blocking.

According to one embodiment, a semiconductor processing system is disclosed. The semiconductor processing system comprises a plasma chamber having: a base; chamber walls; and a top wall, wherein a portion of the top wall comprises a dielectric window; an RF antenna comprising a plurality of coils disposed proximate the dielectric window to provide RF energy to the plasma chamber; an RF power supply to provide power to the RF antenna; and an RF blocker disposed adjacent to the dielectric window to block a portion of the RF energy. In some embodiments, the RF blocker includes one or more openings. In some embodiments, the system comprises a second RF blocker including one or more second openings, wherein the second RF blocker overlaps the RF blocker to create an aggregate blocker. In certain embodiments, the one or more second openings are partially aligned with the one or more openings, such that effective openings in the aggregate blocker are smaller than the openings. In certain embodiments, the one or more second openings are anti-aligned with the one or more openings, such that the aggregate blocker has no openings. In some embodiments, the RF blocker is disposed between the plurality of coils and the dielectric window or between the dielectric window and a center of the plasma chamber. In some embodiments, the RF blocker comprises internal channels adapted to allow a flow of a cooling fluid. In some embodiments, a thickness of the RF blocker varies circumferential or radial direction. In some embodiments, the RF blocker is made of a dielectric material, a metal, or a semiconductor material.

According to a second embodiment, a semiconductor processing system is disclosed. The semiconductor processing system comprises a plasma chamber having a base; chamber walls; and a top wall comprising a lower top surface, a vertical top surface and an upper top surface, wherein the lower top surface comprises a dielectric window; an RF antenna comprising a plurality of coils disposed above the dielectric window to provide RF energy to the plasma chamber; an RF power supply to provide power to the RF antenna; and an RF blocker disposed adjacent to the dielectric window to block a portion of the RF energy, where the RF blocker is shaped as a portion of an annular ring. In some embodiments, the RF blocker is disposed between the plurality of coils and the dielectric window or between the dielectric window and a center of the plasma chamber. In some embodiments, the RF blocker includes one or more openings. In some embodiments, the system comprises a second RF blocker, shaped as a portion of an annular ring, including one or more second openings, wherein the second RF blocker overlaps the RF blocker to create an aggregate blocker. In certain embodiments, the one or more second openings are partially aligned with the one or more openings, such that effective openings in the aggregate blocker are smaller than the openings. In certain embodiments, the one or more second openings are anti-aligned with the one or more openings, such that the aggregate blocker has no openings. In some embodiments, a thickness of the RF blocker varies in a circumferential or radial direction.

According to a third embodiment, a semiconductor processing system for deposition or plasma doping is disclosed. The semiconductor processing system for deposition or plasma doping comprises a plasma chamber maintained at a pressure of at least 30 mTorr, the plasma chamber being cylindrical in shape and having a base; chamber walls; and a top wall comprising a lower top surface, a cylindrical vertical top surface and an upper top surface, wherein at least one of the lower top surface and the cylindrical vertical top surface comprises a dielectric window; an RF antenna comprising a plurality of coils disposed proximate to the dielectric window to provide RF energy to the plasma chamber; an RF power supply to provide power to the RF antenna; and an RF blocker disposed adjacent to the dielectric window to block a portion of the RF energy, where the RF blocker is shaped as a portion of an annular ring. In some embodiments, the RF blocker is disposed between the plurality of coils and the dielectric window or between the dielectric window and a center of the plasma chamber. In some embodiments, the RF blocker includes one or more openings. In some embodiments, the system comprises a second RF blocker, shaped as a portion of an annular ring, including one or more second openings, wherein the second RF blocker overlaps the RF blocker to create an aggregate blocker.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
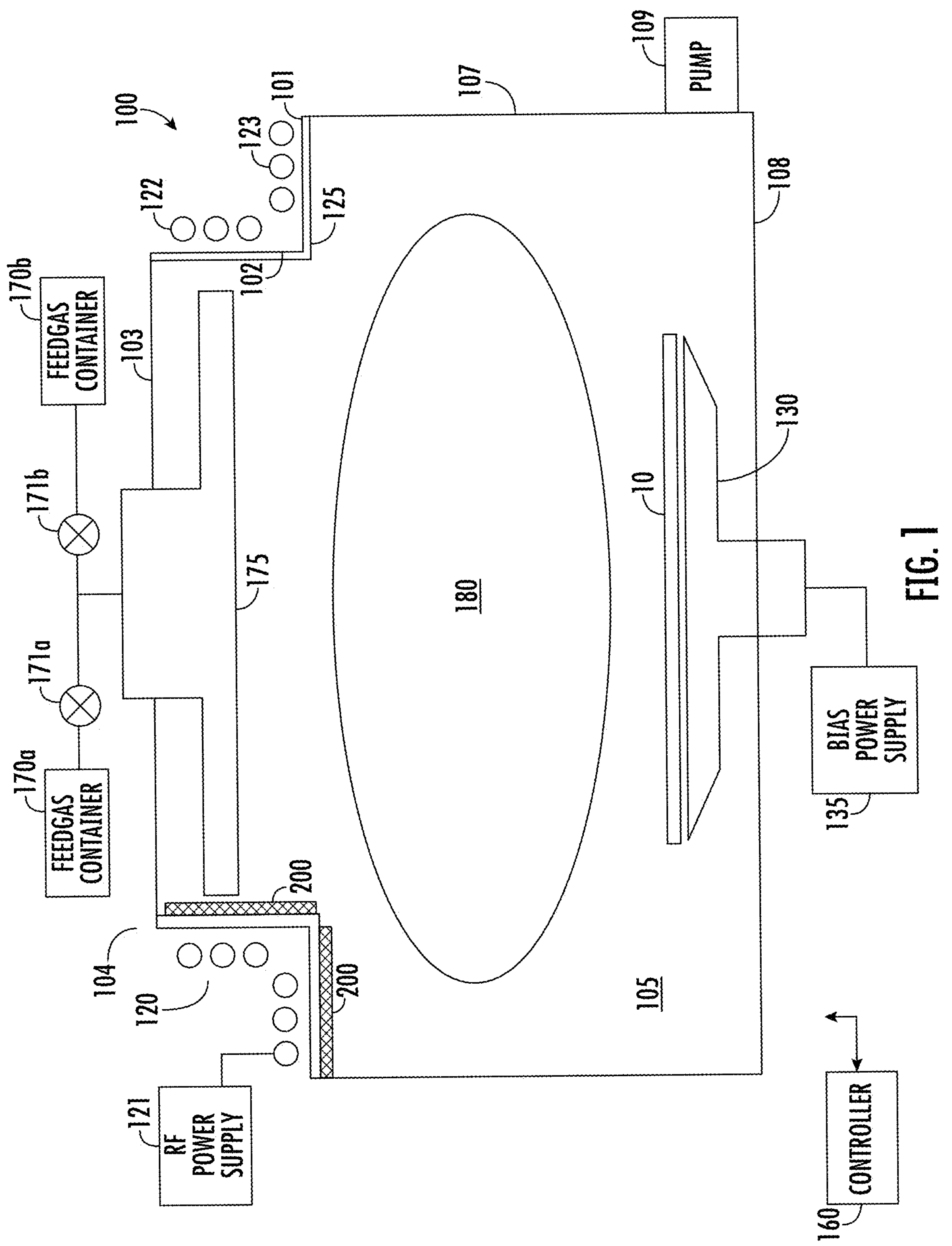
FIG. 1 shows the semiconductor processing system according to one embodiment.

FIG. 1 shows a cross-section of an embodiment of a plasma chamber 105 of a semiconductor processing system 100 that may be used with the present disclosure. The semiconductor processing system 100 may be used to perform deposition or plasma doping. The semiconductor processing system 100 includes the plasma chamber 105 defined by a base 108, and several plasma chamber walls 107, which may be constructed from aluminum, graphite or another suitable material. In some embodiments, the plasma chamber 105 may be cylindrical. This plasma chamber 105 may be supplied with one or more feedgasses, stored in one or more feedgas containers 170*a*, 170*b* that enter the plasma chamber 105 via a gas baffle 175. Mass flow controllers 171*a*, 171*b* may be used to regulate the flow of the feedgas from the feedgas containers 170*a*, 170*b*, respectively, into the plasma chamber 105. Note that there may be more or fewer than 2 mass flow controllers and feedgas containers.

In some embodiments, the flow of the feedgas is regulated such that the pressure within the plasma chamber 105 may be between mTorr and 50 mTorr, although higher pressures may be used. A pump 109 may be used to regulate the pressure within the plasma chamber 105. In some embodiments, the plasma chamber 105 is maintained at high pressure, which is defined as pressures greater than or equal to 30 mTorr, such as between 30 mTorr and 100 mTorr. In some embodiments, the pressure within the plasma chamber 105 may be between 30 mTorr and 50 mTorr. In other embodiments, the pressure may be 50 mTorr or greater.

This feedgas may be energized by an RF antenna 120 or another plasma generation mechanism. The RF antenna 120 is in electrical communication with an RF power supply 121 which supplies power to the RF antenna 120. A dielectric window 125, such as a quartz or alumina window, may be disposed between the RF antenna 120 and the interior of the plasma chamber 105.

In this embodiment, the top wall 104 of the semiconductor processing system 100 includes lower top surface 101, a vertical top surface 102, and an upper top surface 103. The vertical top surface 102 may be cylindrical. The gas baffle 175 may be attached to the upper top surface 103. The RF antenna 120 may include coils 122 that are arranged along the vertical top surface 102 and coils 123 that are arranged along the lower top surface 101. In some embodiments, the coils may be disposed adjacent to only one of these two surfaces. In some embodiments, the vertical top surface 102 is also made of a dielectric material.

A workpiece 10 is disposed within the plasma chamber 105, on a platen 130. The platen 130 is supported by the base 108 and is in electrical communication with a bias power supply 135, which may be used to negatively bias the platen 130 during certain time periods so that positive ions are attracted toward the workpiece 10.

A controller 160 may be in communication with the bias power supply 135, the RF power supply 121 and the mass flow controllers 171*a*, 171*b* that control the flow of feedgasses into the plasma chamber 105. The controller 160 may include a processing unit, such as a microcontroller, a personal computer, a special purpose controller, or another suitable processing unit. The controller 160 may also include a non-transitory computer readable storage element, such as a semiconductor memory, a magnetic memory, or another suitable memory. This non-transitory storage element may contain instructions and other data that allows the controller 160 to perform the functions described herein.

As explained above, in certain embodiments, the plasma density may not be uniform. Specifically, it is typical that the plasma density is not uniform in the radial direction, as the plasma density near the center of the plasma chamber is typically higher than along the edges. However, in some situations, such as when higher pressures are employed, the plasma density may also be nonuniform across the workpiece 10. For example, the plasma density on a first point along the outer edge of the workpiece may be greater than the plasma density at a second point along the outer edge that is opposite the first point. This type of left-right non-uniformity may be caused by various mechanisms, including the effects of the pump 109. Thus, to alleviate this issue, a RF blocker 200 may be installed between a portion of the RF antenna 120 and the center of the plasma chamber 105 where the plasma 180 is located.

The RF blocker 200 may be made of any suitable material. In certain embodiments, the RF blocker 200 is made of a metal. In certain embodiments, the metal may be coated to protect it from the plasma. For example, this coating may be silicon based, or may be an advanced coating, such as $Y_2O_3$, alumina or others. In other embodiments, the RF blocker 200 may be a dielectric material, a ceramic or a semiconducting material.

Figure 2A:
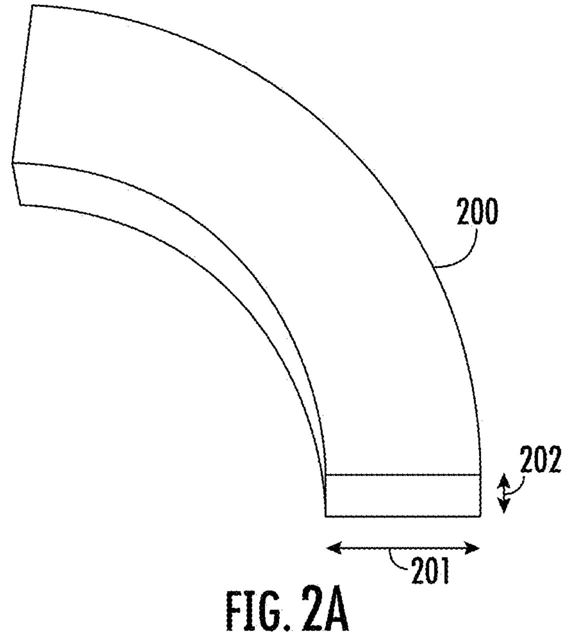
FIGS. 2A-2B show the RF blocker according to two embodiments.
Figure 2B:
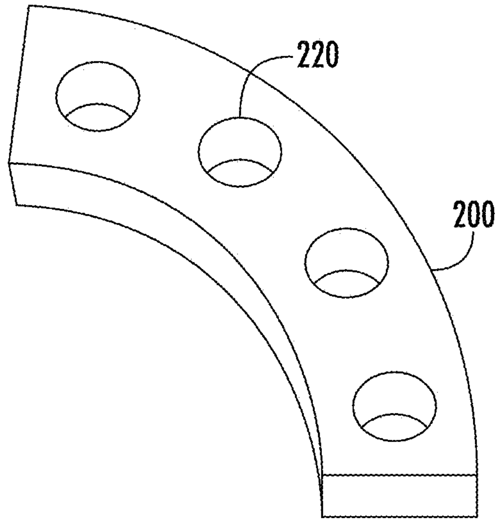

In some embodiments, the RF blocker 200 may be disposed adjacent to the lower top surface 101. In some embodiments, the RF blocker 200 may be disposed between the coil 123 and the lower top surface 101. In other embodiments, the RF blocker 200 may be disposed between the lower top surface 101 and the interior of the plasma chamber 105. For example, the RF blocker 200 may be adjacent to the lower top surface 101. In this embodiment, since the plasma chamber 105 and the vertical top surface 102 are both cylindrical, the RF blocker 200 may be shaped as a portion of a thin annular ring that is disposed between the plasma chamber walls 107 and the vertical top surface 102, as shown in FIG. 2A. For example, the RF blocker 200 may have a thickness 202 that is less than 0.5 inches, and have a width 201, which is in the radial direction, that is less than or equal to the width of the lower top surface 101. In certain embodiments, the thickness of the RF blocker 200 may be between ⅛ and ½ inches, although other thicknesses are possible. The length of the RF blocker 200 in the circumferential direction is implementation dependent. In some embodiments, as shown in FIG. 2B, the RF blocker 200 may include one or more openings 220, as will be described in more detail below.

Figure 3B:
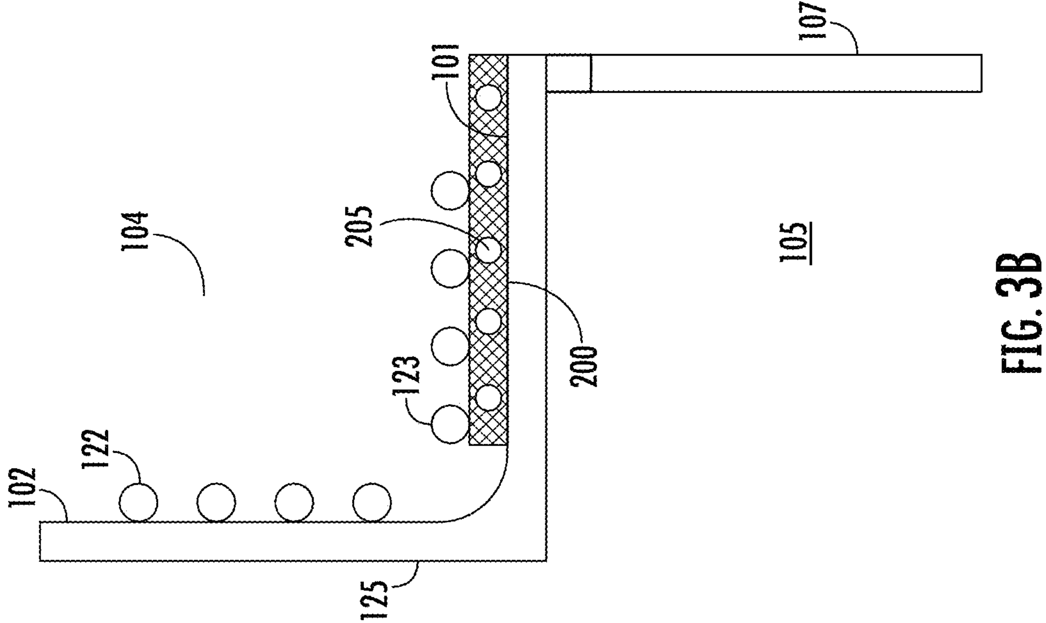
FIGS. 3A-3B show an enlarged view of the top of the semiconductor processing system according to two embodiments.
Figure 3A:
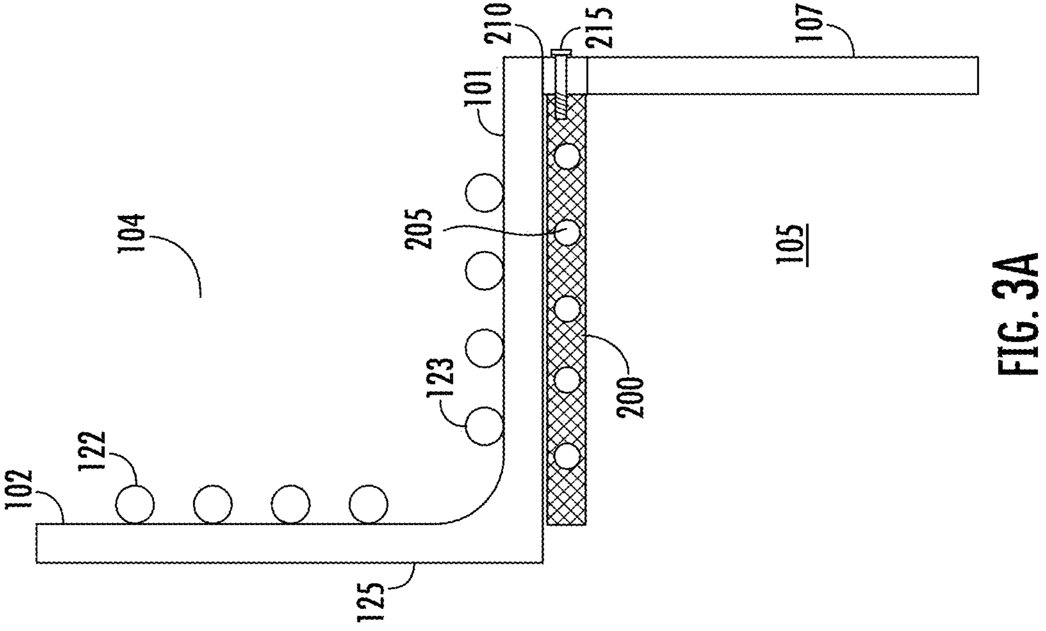

FIG. 3A-3B show an enlarged view of the top wall 104 of the semiconductor processing system 100 according to two embodiments. In these embodiments, the vertical top surface 102 and the lower top surface 101 may both be made of a dielectric material, and therefore constitute the dielectric window 125. In FIG. 3A, the RF blocker 200 is located adjacent to the lower top surface 101 beneath the dielectric window 125, and is held in place by a mounting ring 210 that is disposed on top of the plasma chamber walls 107. For example, the outer diameter of the RF blocker 200 may include threaded holes, such that screws 215 may pass through the mounting ring 210 and affix the RF blocker 200 in place. The mounting ring 210 may include a plurality of holes such that the RF blocker 200 may be disposed in one of a plurality of locations around the circumference of the lower top surface 101.

While FIG. 3A shows the RF blocker 200 located between the dielectric window 125 and the interior of the plasma chamber 105, it is understood that the RF blocker 200 may also be disposed adjacent to the lower top surface 101 between the coils 123 and the dielectric window 125, as shown in FIG. 3B.

Note that, in certain embodiments, the vertical top surface 102 does not need to be a dielectric material, such that RF energy only passes through the lower top surface 101 via coils 123.

Figure 4C:
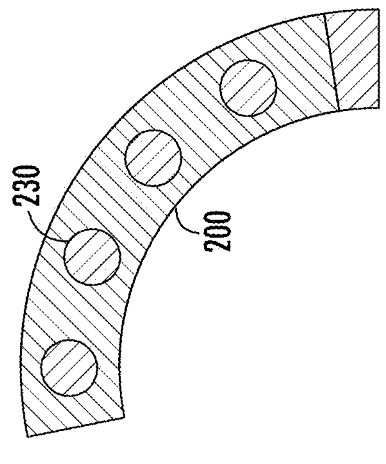
FIGS. 4A-4C show the effects of overlapping two RF blockers.
Figure 4C:
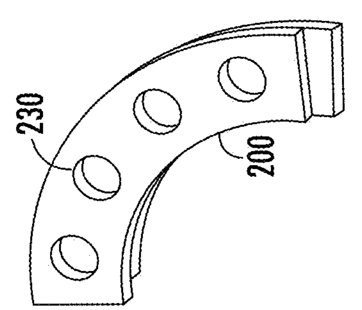
Figure 4C:
Figure 4B:
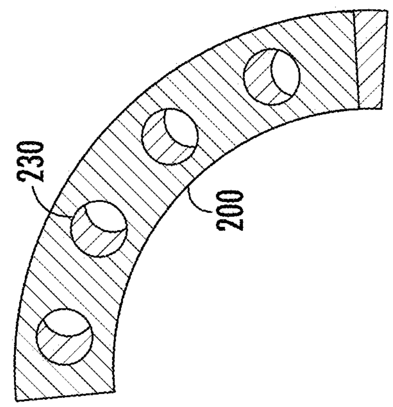
Figure 4B:
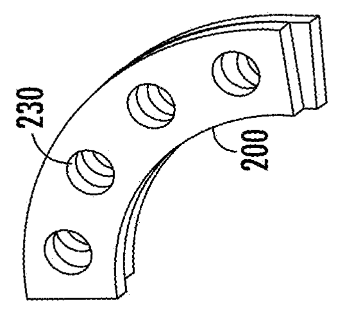
Figure 4A:
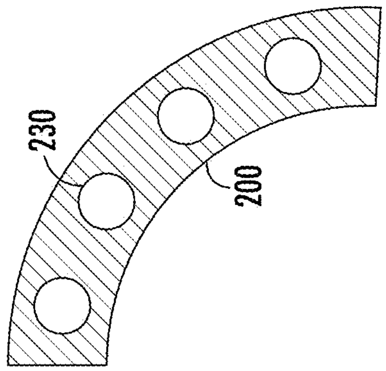
Figure 4A:
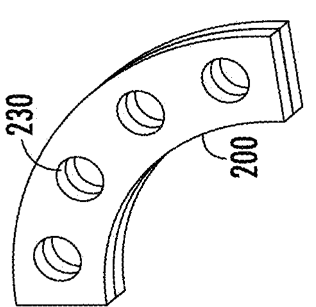

Note that in some embodiments, the RF blocker 200 may include one or more openings 220, as shown in FIG. 2B. These openings 220 may be in the form of holes, which may be slots, circles, or another shape. These openings 220 reduce the ability of the RF blocker 200 to affect the plasma density. Specifically, RF blockers with larger openings may have little shielding or blocking effect. However, if two RF blockers are disposed at least partially on top of one another, an aggregate blocker is created. The amount of shielding provided by the aggregate blocker may be varied. Areas in which the openings in the two RF blockers 200 are aligned create an effective opening. Note that the effective opening in the aggregate RF blocker cannot be larger than the openings in either RF blocker. FIGS. 4A-4C show the effects of different alignment of the two RF blockers. The top figures are top views, while the bottom figures are perspective views. In the top figures, the upper RF blocker is shown using one cross-hatch pattern while the lower RF blocker is shown using a second cross-hatch pattern. Specifically, as shown in FIG. 4A, if there is perfect alignment between the openings 220 on the two RF blockers 200, the size of the effective openings 230 is not affected, and the aggregate blocker provides little blocking of the RF energy. In fact, the lower RF blocker is not visible at all in the top view. If the two RF blockers 200 are slightly offset from each other, as shown in FIG. 4B, the size of the effective openings 230 is made smaller, providing increased blocking from the aggregate blocker. Thus, portions of the lower RF blocker are visible in the top view. Finally, if the two RF blockers 200 are anti-aligned, as shown in FIG. 4C, such that all of the openings 220 in each blocker are covered by the other blocker, the maximum blocking ability is achieved by the aggregate blocker. Thus, the top view shows that there are no openings that extend through both RF blockers.

Thus, the use of multiple RF blockers 200 having openings 220, which may be stacked on top of one another and offset from each other to create variable sized effective openings 230, may be employed as another mechanism to create a variable amount of RF blocking.

In some embodiments, the RF blocker 200 may have different thicknesses, where each thickness represents a certain amount of blocking. This change in thickness may be in the radial direction and/or in the circumferential direction.

Thus, in these embodiments, the RF blocker 200 is disposed adjacent to the lower top surface 101. The region of the plasma which is affected is determined by the placement of the RF blocker 200 along the lower top surface 101. The degree to which the plasma density is affected may be determined by at least one of the thickness of the RF blocker 200, the material used to create the RF blocker 200, the number of openings 220 in the RF blocker, and the size of those openings 220. Further, if an aggregate blocker is used, the degree to which the plasma density is affected is also determined based on the alignment of the RF blockers 200.

Figures 5A, 5B:
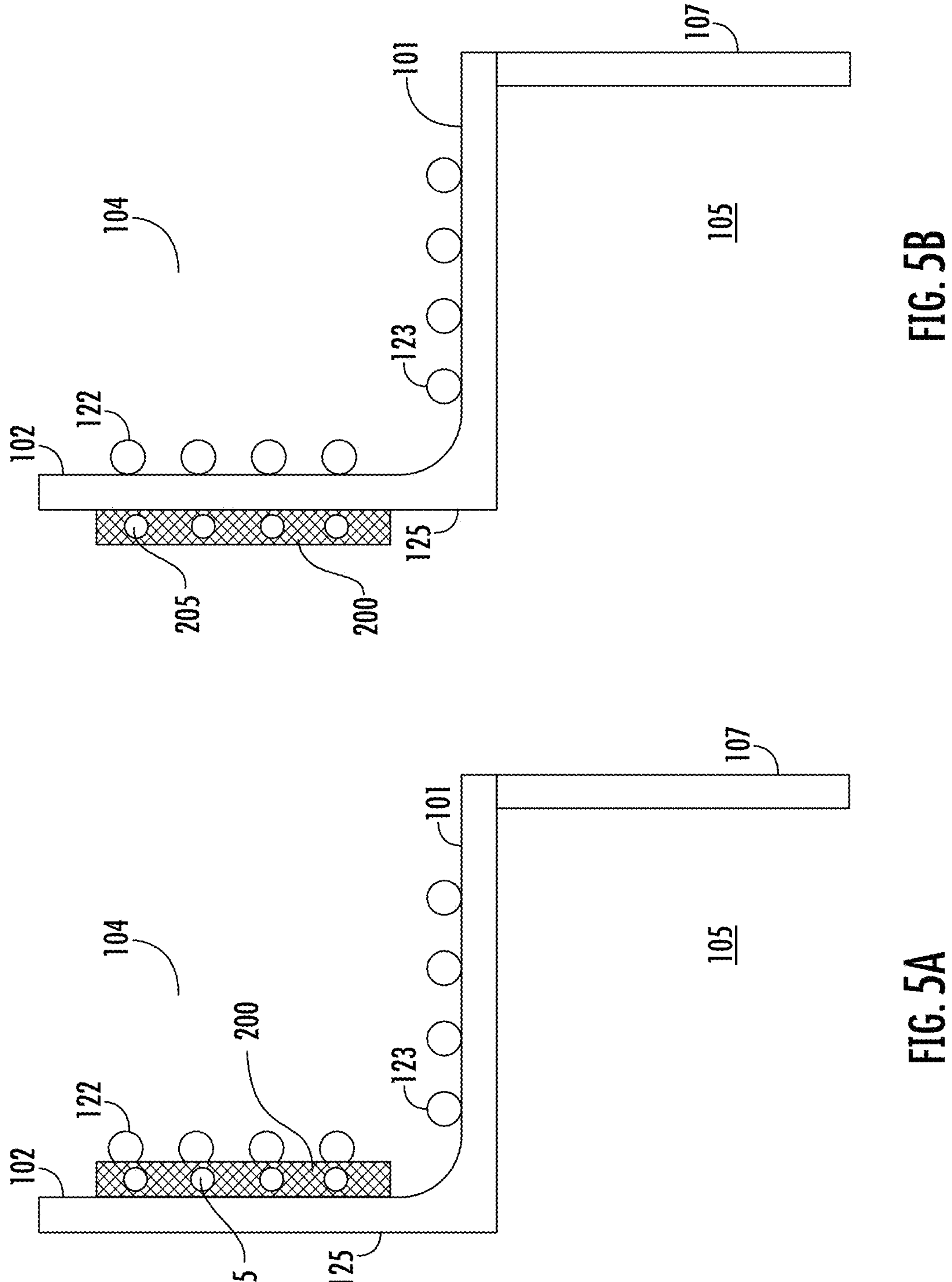
FIGS. 5A-5B show an enlarged view of the top of the semiconductor processing system according to two embodiments.
Figure 6B:
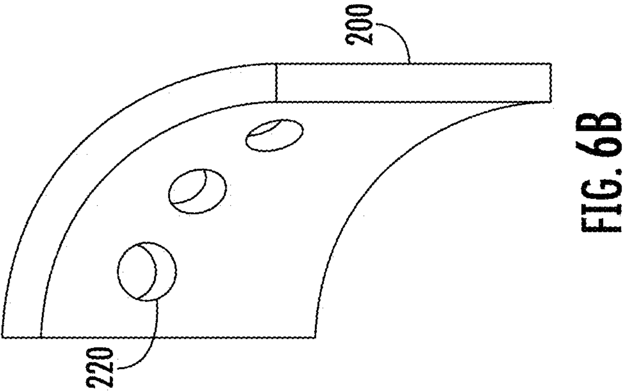
FIGS. 6A-6B show the RF blocker according to two embodiments that may be used in the embodiments shown in FIGS. 5A-5B.
Figure 6A:
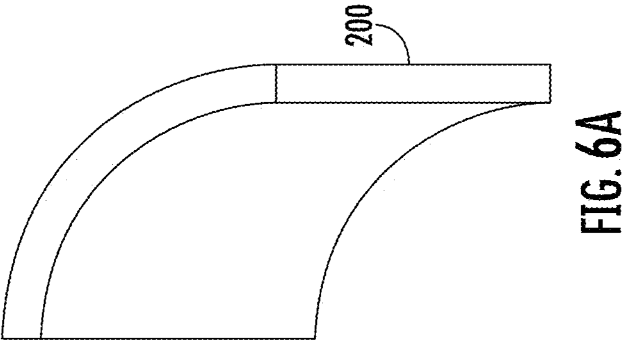

In other embodiments, the RF blocker 200 may be disposed adjacent to the vertical top surface 102. FIGS. 5A-5B show an enlarged view of the top wall 104 of the semiconductor processing system 100 according to another embodiment. FIG. 5A shows the RF blocker 200 disposed between the coils 122 and the dielectric window 125 on the vertical top surface 102. In this embodiment, the RF blocker 200 is shaped as a portion of a tall annular ring, as shown in FIG. 6A. Further, the RF blocker 200 may have one or more openings 220, as shown in FIG. 6B and described above. Additionally, the materials, openings and aggregate blockers described above are also applicable to this embodiment. While FIG. 5A shows the RF blocker 200 located between the coils 122 and the dielectric window 125, the RF blocker 200 may also be disposed between the dielectric window 125 and the interior of the plasma chamber 105 as shown in FIG. 5B. The RF blocker 200 may be adjacent to the vertical top surface 102.

Note that, due to the shape of the top wall 104, the locations in which the RF blockers 200 may be disposed are somewhat limited to the circumferential direction.

Figure 7:
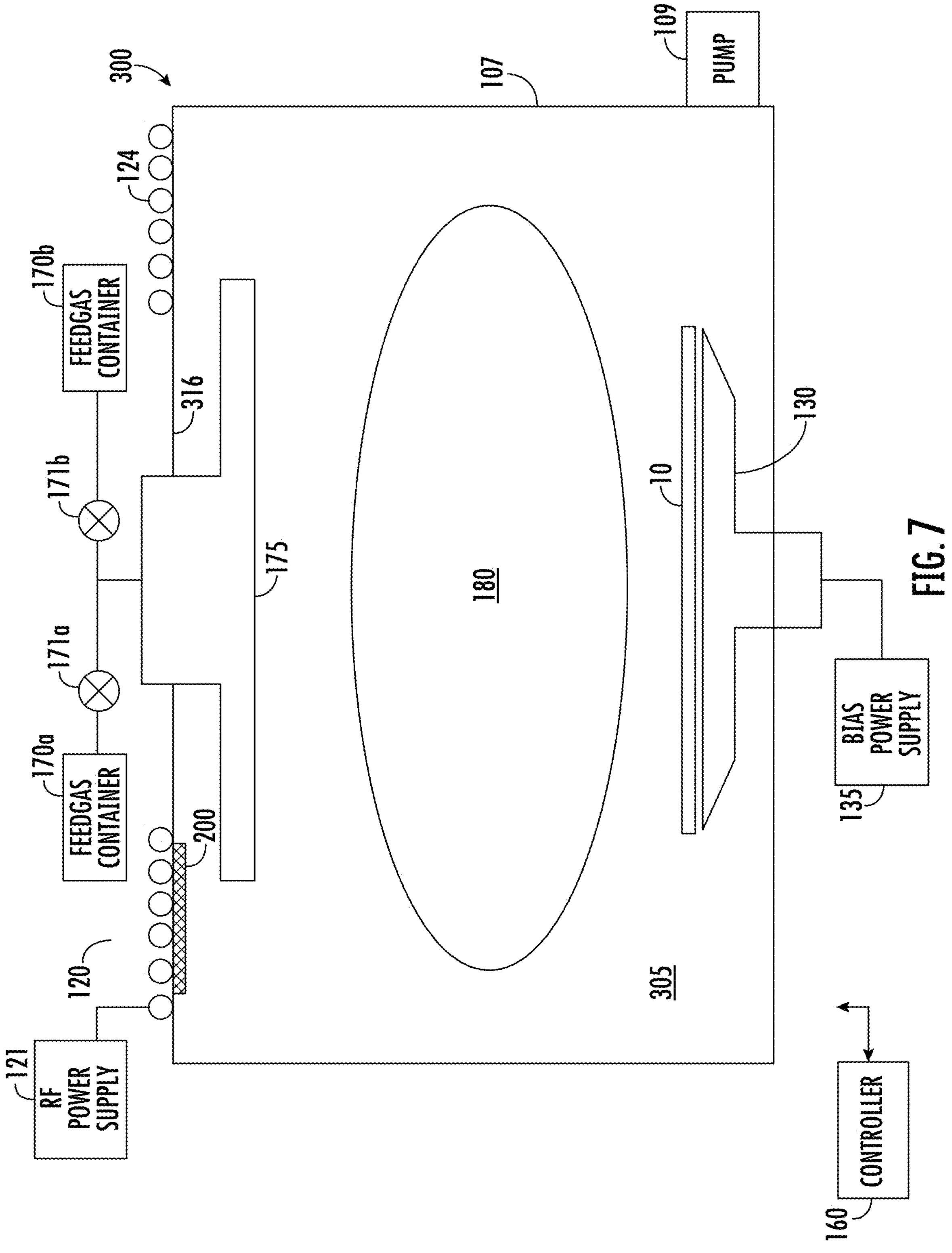
FIG. 7 shows the semiconductor processing system according to another embodiment.
Figures 8A, 8B, 8C:
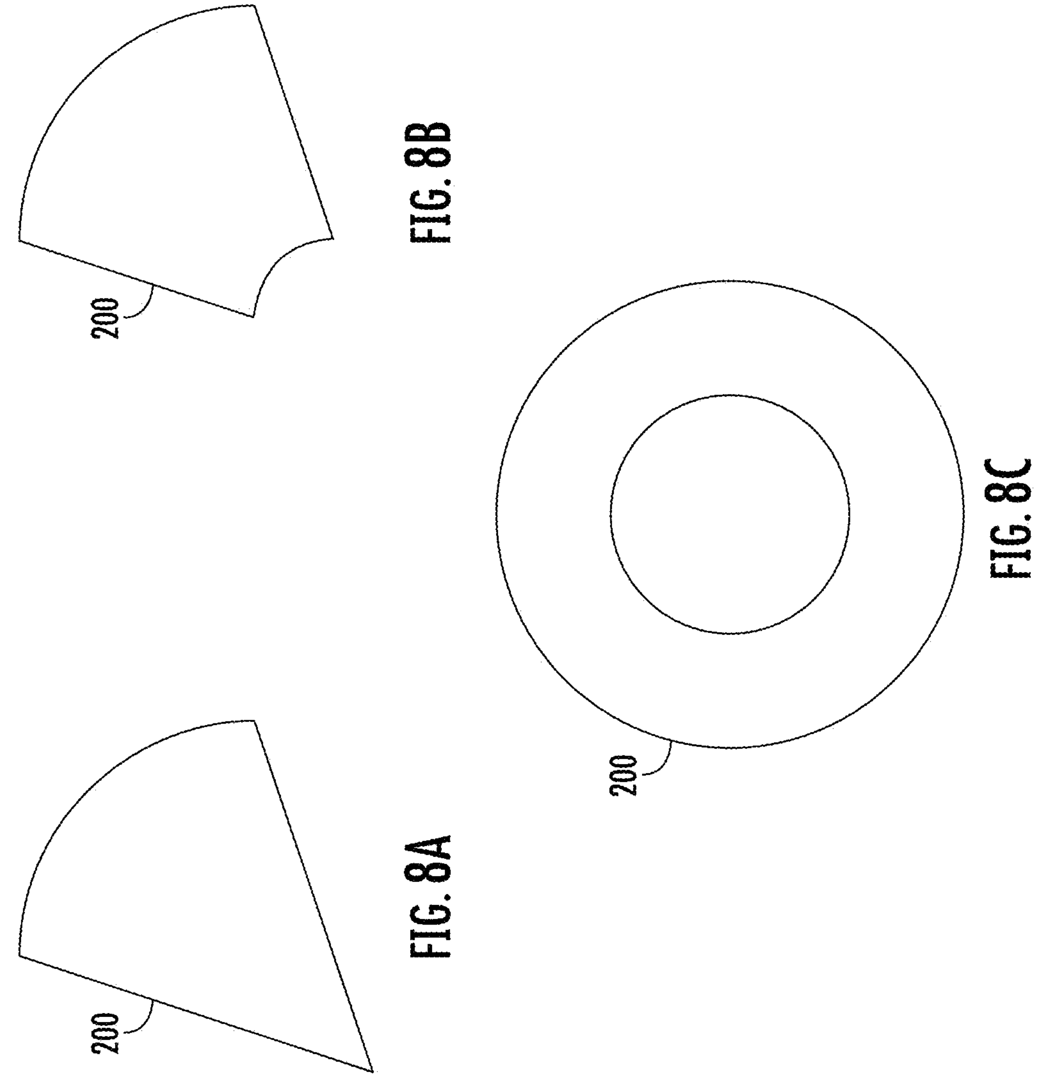
FIGS. 8A-8C show the RF blocker according to three embodiments.

FIG. 7 shows a semiconductor processing system 300 that utilizes a differently shaped plasma chamber 305. In this embodiment, the top wall 316 is planar. The RF antenna 120 comprises a plurality of coils 124 disposed on this planar top surface. The rest of the semiconductor processing system 300 is similar to that described above with respect to FIG. 1. In this embodiment, the RF blocker 200 may be moved in both the radial direction and the circumferential direction. For example, if the plasma density non-uniformity is disposed near the center of the plasma chamber 315, the RF blocker 200 may be placed close to the center. Conversely, if the plasma density non-uniformity is disposed near the edge of the plasma chamber 315, the RF blocker 200 may be placed close to the plasma chamber walls 107, similar to that shown in FIGS. 3A-3B. Further, in this embodiment, the shape of the RF blocker 200 is not confined to being a portion of an annular ring; rather, it may be any shape and size. For example, the RF blocker 200 may be wedge shaped, which is defined as a shape having an arced edge in contact with two straight edges that converge at a point, as shown in FIG. 8A. The RF blocker 200 may be a truncated wedge, as shown in FIG. 8B. The RF blocker 200 may also be an annular ring as shown in FIG. 8C, or a portion of an annular ring, similar to that shown in FIG. 2A. Further, the RF blocker 200, regardless of shape, may include one or more openings 220 as described above.

In certain embodiments, the RF blocker 200 may absorb some of the RF energy emitted by the RF antenna, causing it to heat. In these embodiments, fluid channels 205 (see FIGS. 3A-3B and 5A-5B) may be embedded within the RF blocker 200 to allow the flow of a cooling fluid, such as a gas or liquid, through these internal fluid channels.

Figure 9B:
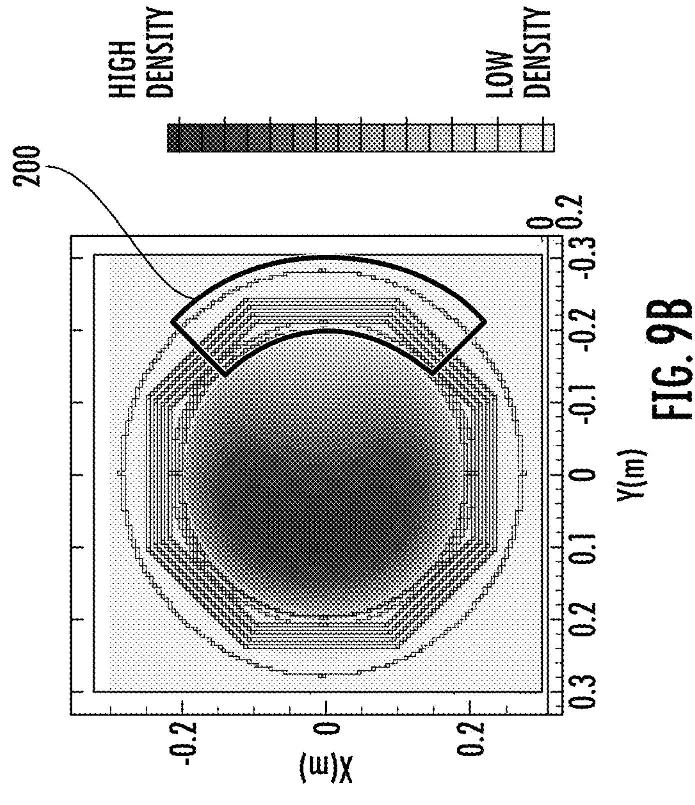
FIGS. 9A-9B show plots of plasma density demonstrating the effect of the RF blocker.
Figure 9A:
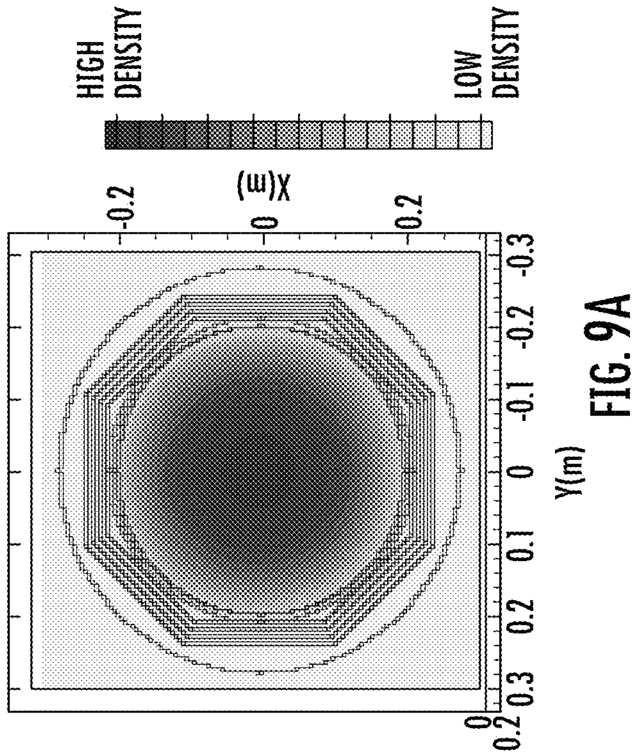

The embodiments described in this disclosure may have many advantages. As noted above, the plasma density within the plasma chamber may be non-uniform. The use of one or more RF blockers may allow the plasma density to be tuned. For example, FIG. 9A shows the plasma density of a representative plasma chamber, when viewed from above. In this example, the plasma density is assumed to be uniform in the circumferential direction. In FIG. 9B, an RF blocker 200 is disposed on the right side of the plasma chamber. Note that the plasma density near the RF blocker 200 has been reduced, while the plasma density away from the RF blocker 200 is increased. Thus, in practice, the RF blocker 200 may be located in regions where the plasma density is greatest. For example, if the plasma density within the plasma chamber was nonuniform and was greater at the right side, positioning the RF blocker 200 as shown in FIG. 9B would reduce the plasma density in that region while increasing the plasma density in other regions, making the overall plasma density more uniform. This may be particularly useful when correcting left-right nonuniformity. Further, the RF blocker 200 may be readily installed and removed and may be incorporated into existing semiconductor processing systems. Additionally, the RF blocker 200 may be used to compensate for known nonuniformities elsewhere in the manufacturing process by intentionally creating plasma density nonuniformity in the plasma chamber.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A semiconductor processing system, comprising:

a plasma chamber having:

a base;

chamber walls; and a top wall; wherein at least one of the walls comprises a dielectric window;

an RF antenna comprising a plurality of coils disposed proximate the dielectric window to provide RF energy to the plasma chamber;

an RF power supply to provide power to the RF antenna;

a first RF blocker disposed adjacent to the dielectric window to block a portion of the RF energy;

wherein the first RF blocker includes one or more openings; and a second RF blocker including one or more second openings, wherein the second RF blocker overlaps the first RF blocker to create an aggregate blocker.

2. The semiconductor processing system of claim 1, wherein the one or more second openings are partially aligned with the one or more openings, such that effective openings in the aggregate blocker are smaller than the openings.

3. The semiconductor processing system of claim 1, wherein the one or more second openings are anti-aligned with the one or more openings, such that the aggregate blocker has no openings.

4. The semiconductor processing system of claim 1, wherein the RF blocker is made of a dielectric material, a metal, or a semiconductor material.

5. The semiconductor processing system of claim 1, wherein the top wall comprises the dielectric window.

6. The semiconductor processing system of claim 1, wherein the top wall comprises a lower top surface, a vertical top surface and an upper top surface, and wherein at least one of the lower top surface and the cylindrical vertical top surface comprises the dielectric window.

7. The semiconductor processing system of claim 1, wherein the RF blocker is disposed between the plurality of coils and the dielectric window or between the dielectric window and a center of the plasma chamber.

8. A semiconductor processing system, comprising:

a plasma chamber having:

a base;

chamber walls; and a top wall; wherein at least one of the walls comprises a dielectric window;

an RF antenna comprising a plurality of coils disposed proximate the dielectric window to provide RF energy to the plasma chamber;

an RF power supply to provide power to the RF antenna;

an RF blocker disposed adjacent to the dielectric window to block a portion of the RF energy; wherein the RF blocker comprises internal channels adapted to allow a flow of a cooling fluid.

9. The semiconductor processing system of claim 8, wherein the RF blocker is made of a dielectric material, a metal, or a semiconductor material.

10. The semiconductor processing system of claim 8, wherein the RF blocker is disposed between the plurality of coils and the dielectric window or between the dielectric window and a center of the plasma chamber.

* * * * *